United States Patent
Harada

(10) Patent No.: US 11,916,001 B2
(45) Date of Patent: Feb. 27, 2024

(54) SEMICONDUCTOR POWER MODULE AND POWER CONVERSION DEVICE

(71) Applicant: Mitsubishi Electric Corporation, Chiyoda-ku (JP)

(72) Inventor: Kozo Harada, Chiyoda-ku (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 835 days.

(21) Appl. No.: 16/961,774

(22) PCT Filed: Dec. 13, 2018

(86) PCT No.: PCT/JP2018/045814
§ 371 (c)(1),
(2) Date: Jul. 13, 2020

(87) PCT Pub. No.: WO2019/176199
PCT Pub. Date: Sep. 19, 2019

(65) Prior Publication Data
US 2020/0395278 A1 Dec. 17, 2020

(30) Foreign Application Priority Data
Mar. 14, 2018 (JP) .................................. 2018-046377

(51) Int. Cl.
*H01L 23/498* (2006.01)
*H01L 23/04* (2006.01)
(Continued)

(52) U.S. Cl.
CPC ...... *H01L 23/49811* (2013.01); *H01L 23/041* (2013.01); *H01L 23/142* (2013.01);
(Continued)

(58) Field of Classification Search
CPC ............ H01L 23/49811; H01L 23/041; H01L 23/3121; H01L 23/3135; H01L 23/053
See application file for complete search history.

(56) References Cited

U.S. PATENT DOCUMENTS

| | | |
|---|---|---|
| 2010/0013086 A1 | 1/2010 | Obiraki et al. |
| 2012/0098138 A1 | 4/2012 | Oka et al. |
| 2012/0306091 A1 | 12/2012 | Stolze et al. |

FOREIGN PATENT DOCUMENTS

| | | | |
|---|---|---|---|
| CN | 102237326 A | * 11/2011 | ............ H01L 23/04 |
| CN | 110323186 A | * 10/2019 | ............ H01L 21/52 |

(Continued)

OTHER PUBLICATIONS

International Search Report dated Feb. 26, 2019 in PCT/JP2018/045814 filed on Dec. 13, 2018, 2 pages.
(Continued)

*Primary Examiner* — Aaron J Gray
*Assistant Examiner* — Mario Andres Autore, Jr.
(74) *Attorney, Agent, or Firm* — XSENSUS LLP

(57) ABSTRACT

A semiconductor power module includes a base plate, an insulating substrate, a power semiconductor element, an external terminal, a main terminal, a connected body, a case, a highly-insulating voltage-resisting resin material, a sealing resin, and a cover. The main terminal is connected to the connected body. The connected body is directly joined to the metal plate. The connected body is provided with a receiving section in which the main terminal is received. The receiving section is provided with a slit portion. The slit portion extends from a lower end side of the receiving section toward an upper end side thereof. The lower end side is located on a side close to the insulating substrate. The upper end side is located opposite to the side close to the insulating substrate.

15 Claims, 19 Drawing Sheets

(51) Int. Cl.
  *H01L 23/14* (2006.01)
  *H01L 23/31* (2006.01)
  *H02M 7/5387* (2007.01)
  *H02P 27/08* (2006.01)

(52) U.S. Cl.
  CPC ...... *H01L 23/3121* (2013.01); *H01L 23/3135* (2013.01); *H02M 7/53871* (2013.01); *H02P 27/08* (2013.01)

(56) References Cited

FOREIGN PATENT DOCUMENTS

| | | |
|---|---|---|
| DE | 10 2012 208 146 A1 | 12/2012 |
| EP | 0 962 974 A2 | 12/1999 |
| JP | 2000-216332 A | 8/2000 |
| JP | 3466329 B2 * | 11/2003 ....... H01L 2224/480 |
| JP | 2004-235566 A | 8/2004 |
| JP | 2010-27813 A | 2/2010 |
| JP | 2012-89681 A | 5/2012 |

OTHER PUBLICATIONS

German Office Action dated Dec. 11, 2023, in corresponding German Patent Application 11 2018 007 278.9, 14 pages.

* cited by examiner

SEMICONDUCTOR POWER MODULE AND POWER CONVERSION DEVICE

TECHNICAL FIELD

The present invention relates to a semiconductor power module and a power conversion device, and particularly to a semiconductor power module in which a power semiconductor element is sealed by a sealing material, and a power conversion device to which the semiconductor power module is applied.

BACKGROUND ART

One type of semiconductor element having a current-carrying path formed in its longitudinal direction in order to deal with a high voltage and a high current is generally called as a power semiconductor element. Examples of such a power semiconductor element include an insulated gate bipolar transistor (IGBT), a metal oxide semiconductor field effect transistor (MOSFET), a bipolar transistor, a diode, and the like.

A semiconductor power module having a power semiconductor element mounted on an insulating substrate and sealed by a sealing resin is used in a wide range of fields such as industrial equipment, automobiles, and railroad service. In recent years, as devices each equipped with a semiconductor power module have been improved in performance, there has been an increasing demand to improve the performance of such semiconductor power modules, for example, to increase a rated voltage and a rated current, and to enlarge the range of the temperature to be used (to raise or lower a temperature).

A package structure of the semiconductor power module is mainly what is called a case structure. In a case-type semiconductor power module, a power semiconductor element is mounted on a heat-dissipating base plate with an insulating substrate interposed therebetween. A case is bonded to the base plate so as to surround the power semiconductor element.

The power semiconductor element mounted inside the semiconductor power module is electrically connected to a main electrode. The power semiconductor element and the main electrode are electrically connected using a bonding wire. For the purpose of preventing an insulation failure from occurring upon application of a high voltage, a silicone gel, an epoxy resin or the like is generally used as a sealing resin for a semiconductor power module.

Examples of a patent literature (PTL) disclosing a semiconductor power module (a semiconductor device) includes PTL 1. PTL 1 proposes a power semiconductor device in which a main terminal as a part of a main circuit is joined to a metal pattern disposed on an insulating substrate by a direct metal bonding method such as ultrasonic joining or thermocompression bonding. This power semiconductor device allows high reliability to be achieved in the joining portion between the main terminal and the insulating substrate.

However, at the interface between the sealing resin and the insulating substrate, heat generated by the operation of the semiconductor power module may produce air bubbles in the sealing resin. Also, the sealing resin may peel off from the insulating substrate. This consequently causes a problem that the insulation performance of the semiconductor power module deteriorates on the creepage of the insulating substrate.

In order to solve the above-described problem, for example, PTL 2 proposes a semiconductor device to which a highly-insulating voltage-resisting resin material having higher insulation performance is applied. In this semiconductor device, the insulation performance is ensured by a highly-insulating voltage-resisting resin material covering the creepage of the insulating substrate and the surface of the base plate from the power semiconductor element mounted on the insulating substrate to the base plate.

CITATION LIST

Patent Literature

PTL 1: Japanese Patent Laying-Open No. 2004-235566
PTL 2: Japanese Patent Laying-Open No. 2000-216332

SUMMARY OF INVENTION

Technical Problem

However, in the above-mentioned semiconductor power module, the highly-insulating voltage-resisting resin material may be introduced insufficiently due to the procedure of steps of assembling a semiconductor power module. In the semiconductor power module, generally, a main terminal is joined to a metal pattern disposed on an insulating substrate, and thereafter, a highly-insulating voltage-resisting resin material is applied thereto.

In the step procedure as described above, there are many extraction paths particularly in the metal pattern on the insulating substrate that extend from a joining portion having a main terminal joined thereto to an external terminal. Thus, in a complicated semiconductor power module, the main terminal prevents stable application of a highly-insulating voltage-resisting resin material.

Consequently, a portion onto which a highly-insulating voltage-resisting resin material is not applied may exist inside the semiconductor power module. Furthermore, inclusion of air bubbles may occur in the applied highly-insulating voltage-resisting resin material. As a result, these problems may lead to an insulation failure.

The present invention has been made in order to solve the above-described problems. One object of the present invention is to provide a semiconductor power module improved in insulation performance. Another object of the present invention is to provide a power conversion device to which such a semiconductor power module is applied.

Solution to Problem

A semiconductor power module according to the present invention includes a base plate, an insulating substrate, a power semiconductor element, a case member, a main terminal, a connected body, and a sealing material. The insulating substrate is mounted on the base plate and includes a conductive pattern. The power semiconductor element is mounted on the conductive pattern. The case member is mounted on the base plate so as to surround the insulating substrate. The main terminal is attached to the case member and electrically connects to an outside. The connected body is connected to the conductive pattern. The main terminal is connected to the connected body. The sealing material is introduced into the case member to seal the insulating substrate, the main terminal and the connected body. The main terminal and the connected body include: a receiving section provided in one of the main terminal and the connected body and receiving the other of the main terminal and the connected body; and a slit portion formed in the receiving section so as to extend from a first end portion of the receiving section toward a second end portion of the receiving section. The first end portion is located on a side close to the insulating substrate. The second end portion is located opposite to the side close to the insulating substrate.

A power conversion device according to the present invention is a power conversion device to which the above-mentioned semiconductor power module is applied, and includes a main conversion circuit and a control circuit. The main conversion circuit converts received electric power and outputs converted electric power. The control circuit outputs a control signal for controlling the main conversion circuit to the main conversion circuit.

Advantageous Effects of Invention

The semiconductor power module according to the present invention includes a main terminal and a connected body to which the main terminal is connected. Thus, a sealing material is introduced before the main terminal is connected to the connected body, thereby allowing reliable filling with the sealing material. As a result, the insulation performance can be improved.

In the power conversion device according to the present invention, the above-mentioned semiconductor power module is applied, so that a power conversion device having high insulation performance can be achieved.

DESCRIPTION OF EMBODIMENTS

First Embodiment

Figure 1:
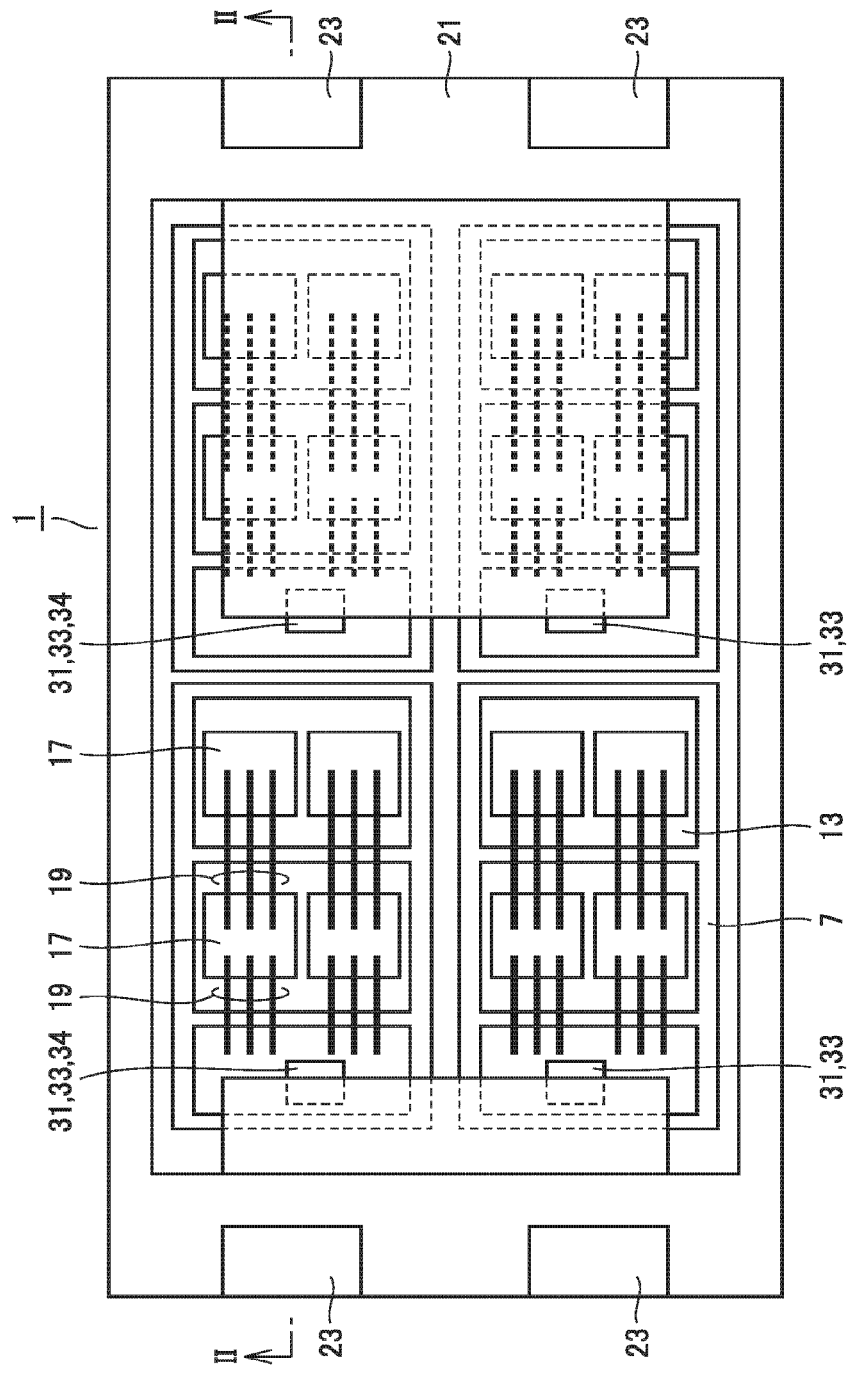
FIG. 1 is a plan view of a semiconductor power module according to each embodiment of the present invention.
Figure 2:
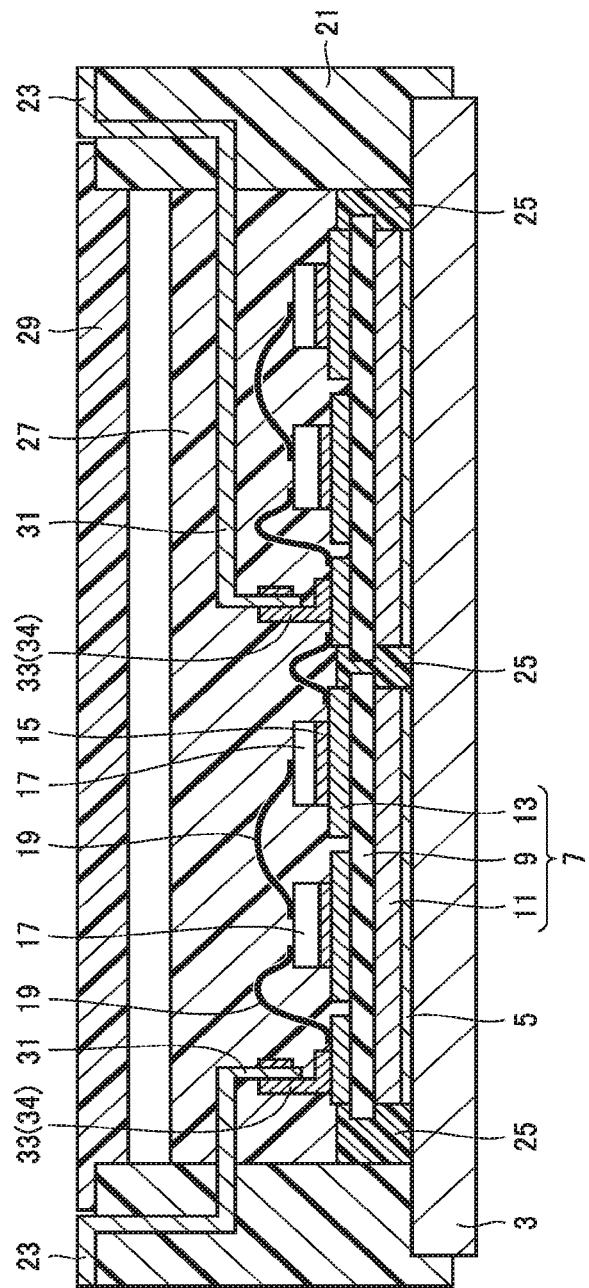
FIG. 2 is a view of a semiconductor power module according to the first embodiment of the present invention in a cross section taken along a cross-sectional line II-II shown in FIG. 1.

A semiconductor power module according to the first embodiment will be hereinafter described. As shown in FIGS. 1 and 2, semiconductor power module 1 mainly includes a base plate 3, an insulating substrate 7, a power semiconductor element 17, an external terminal 23, a main terminal 31, a connected body 33, a case 21, a highly-insulating voltage-resisting resin material 25, a sealing resin 27, and a cover 29.

Insulating substrate 7 includes an insulating layer 9 and metal plates 11 and 13. Metal plates 11 and 13 each are formed as a conductive pattern on insulating layer 9. As insulating substrate 7, for example, aluminum oxide, aluminium nitride, ceramic such as silicon nitride, an epoxy resin or the like is applied. Metal plate 11 is disposed on one surface of insulating layer 9 while metal plate 13 is disposed on the other surface of insulating layer 9. As metal plates 11 and 13, for example, copper, aluminum or the like is applied.

Metal plate 11 is joined by solder 5 to base plate 3. Power semiconductor element 17 is joined by solder 15 to metal plate 13. In addition to solder 5 and solder 15, for example, sintered silver, an electrically conductive adhesive material, a transient liquid phase bonding technique or the like may be used for joining.

Examples of power semiconductor element 17 may be: a power semiconductor element for power control such as an IGBT and an MOSFET; a freewheeling diode; and the like. Power semiconductor elements 17 are electrically connected to each other by a bonding wire 19. Furthermore, power semiconductor element 17 and metal plate 13 are electrically connected to each other by bonding wire 19. As bonding wire 19, for example, a wire rod made of an aluminium alloy or a copper alloy and having a wire diameter of 0.1 mm to 0.5 mm is applied. In addition to a bonding wire, a bonding ribbon may be applied.

Main terminal 31 is a flat plate-shaped electrode made of copper. In this case, main terminal 31 is insert-molded into case 21. Main terminal 31 may be outsert-molded into case 21. One end portion of main terminal 31 is electrically connected to metal plate 13 with connected body 33 interposed therebetween. The other end portion of main terminal 31 is exposed as external terminal 23 to the outside of case 21. The current and the voltage are input/output through main terminal 31.

Case 21 is bonded to base plate 3 with an adhesive (not shown). As a material of case 21, a polyphenylene sulfide (PPS) resin or a polybutylene terephthalate (PBT) resin is generally applied.

Highly-insulating voltage-resisting resin material 25 as the first sealing material and sealing resin 27 as the second sealing material are introduced into case 21 for ensuring the insulation performance inside semiconductor power module 1. A silicone gel may be applied as sealing resin 27. The coefficient of linear expansion of the silicone gel is 300 ppm/K to 400 ppm/K. The coefficient of linear expansion of the silicone gel is several tens of times to several hundreds of times as large as the coefficient of linear expansion (3 ppm/K to 25 ppm/K) of other components that are used in semiconductor power module 1. Furthermore, highly-insulating voltage-resisting resin material 25 is preferably a resin like a highly-insulating silicone material in a liquid state, for example.

In order to deal with the improved performance of the device equipped with semiconductor power module 1, semiconductor power module 1 is required to operate at a high temperature. When semiconductor power module 1 is exposed to a high temperature, a silicone gel thermally expands more largely than other components. Thus, air bubbles may occur at the interface between the silicone gel and insulating substrate 7. Furthermore, the silicone gel may peel off from insulating substrate 7. It is known that an insulation failure consequently occurs on the creepage of insulating substrate 7.

Furthermore, an epoxy resin may be applied as sealing resin 27. In the case of an epoxy resin, when semiconductor power module 1 operates at a high temperature, the adhesive strength of the epoxy resin may decrease. When the adhesive strength of the epoxy resin decreases, peeling may occur at the interface between the epoxy resin and insulating substrate 7. It is known that an insulation failure consequently occurs on the creepage of insulating substrate 7.

Thus, in order to raise the breakdown voltage from insulating substrate 7 to base plate 3, highly-insulating voltage-resisting resin material 25 is applied. Highly-insulating voltage-resisting resin material 25 is introduced (applied) into case 21 so as to cover the creepage of insulating substrate 7 and the surface of base plate 3 from the end surface of metal plate 13 to base plate 3. Sealing resin 27 is introduced into case 21 to the height below which power semiconductor element 17, bonding wire 19, and main terminal 31 are enclosed.

Cover 29 is attached to the upper portion of case 6 so as to cover the inside of case 21. Cover 29 serves to separate semiconductor power module 1 into an inner portion and an outer portion to prevent dust particles and the like from entering the inside of semiconductor power module 1. Cover 29 is fixed to case 21 with an adhesive (not shown) or a screw (not shown).

Figure 3:
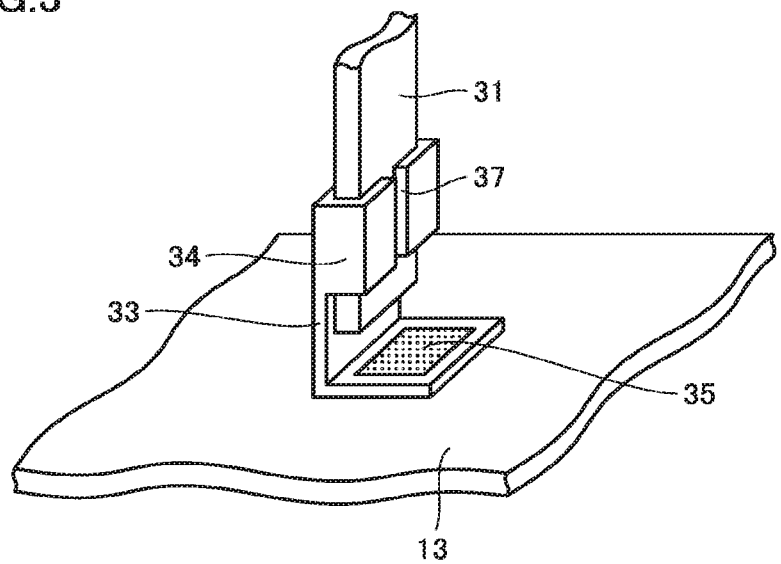
FIG. 3 is an enlarged partial perspective view showing a region of a main terminal and a connected body in the first embodiment.

In the following, main terminal 31 and connected body 33 will be described in further detail. As shown in FIG. 3, main terminal 31 is connected to connected body 33. Connected body 33 is, for example, directly joined to metal plate 13 by ultrasonic waves or directly joined to metal plate 13 by a metal joining method such as thermocompression bonding. The portion where connected body 33 and metal plate 13 are directly joined to each other is a metal-to-metal joining portion 35.

Connected body 33 is provided with a receiving section 34 in which main terminal 31 is received. Receiving section 34 has a rectangular box-shaped tube, for example. Receiving section 34 is provided with a slit portion 37. Slit portion 37 extends from the lower end side as the first end portion of receiving section 34 toward the upper end side as the second end portion of receiving section 34. The first end portion is located on a side close to insulating substrate 7 (metal plate 13). The second end portion is located opposite to the side close to insulating substrate 7. Main terminal 31 is inserted from the upper end side of receiving section 34 and received in receiving section 34. Main terminal 31 is electrically connected to metal plate 13 with connected body 33 interposed therebetween, to thereby allow suppression of an insulation failure, which will be described later.

Figure 4:
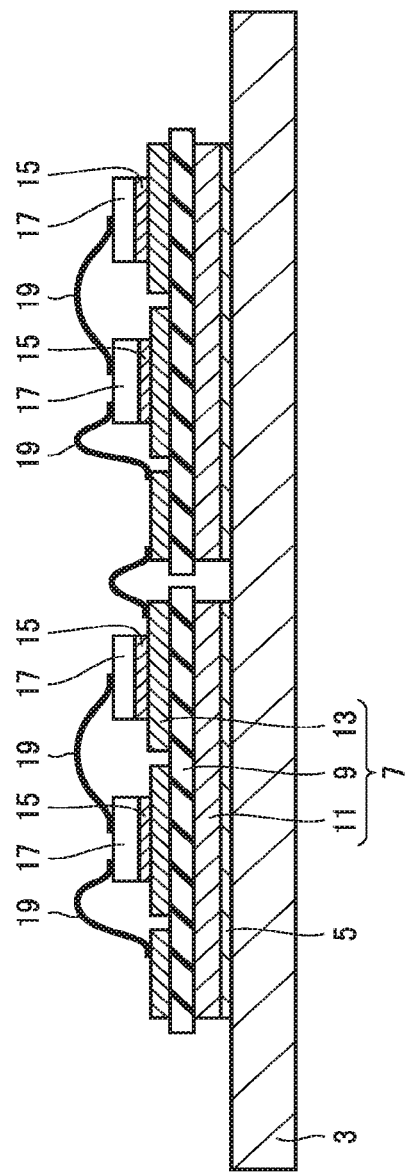
FIG. 4 is a cross-sectional view showing one step of a method of manufacturing a semiconductor power module in the first embodiment.

The following is an explanation about an example of a method of manufacturing the above-mentioned semiconductor power module 1. First, insulating substrate 7 including insulating layer 9 and metal plates 11 and 13 is prepared (see FIG. 4). Then, each of a plurality of power semiconductor elements 17 is joined by solder 15 to a corresponding metal plate 13 of insulating substrate 7. One power semiconductor element 17, another power semiconductor element 17 and the like are connected by a bonding wire. Then, as shown in FIG. 4, metal plate 11 of insulating substrate 7 having power semiconductor element 17 mounted thereon is joined to base plate 3 by solder 5.

Figure 5:
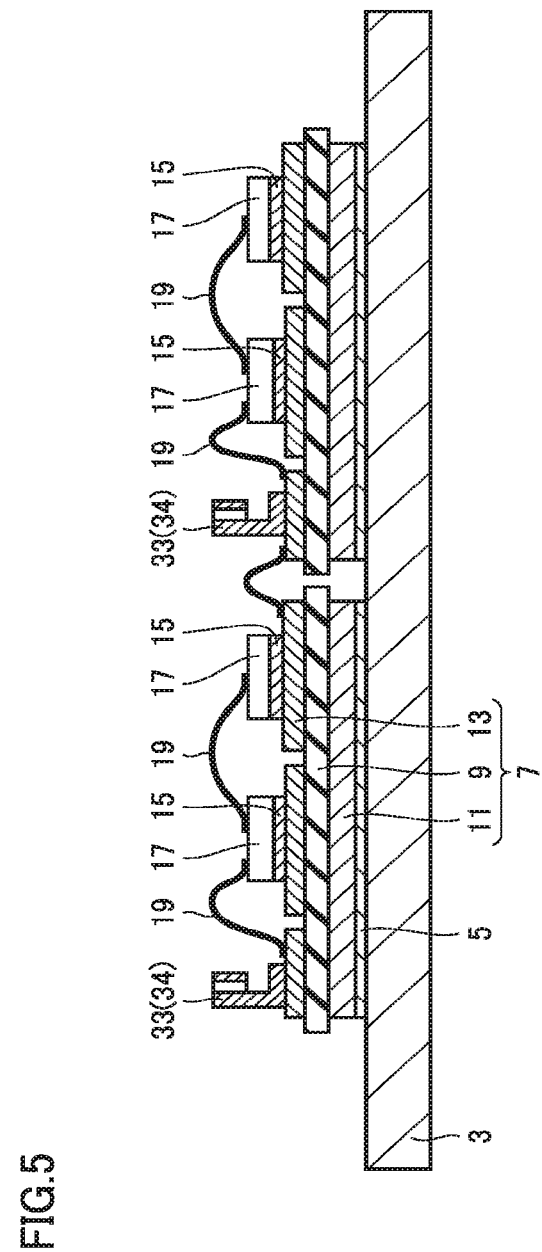
FIG. 5 is a cross-sectional view showing a step performed after the step shown in FIG. 4 in the first embodiment.
Figure 6:
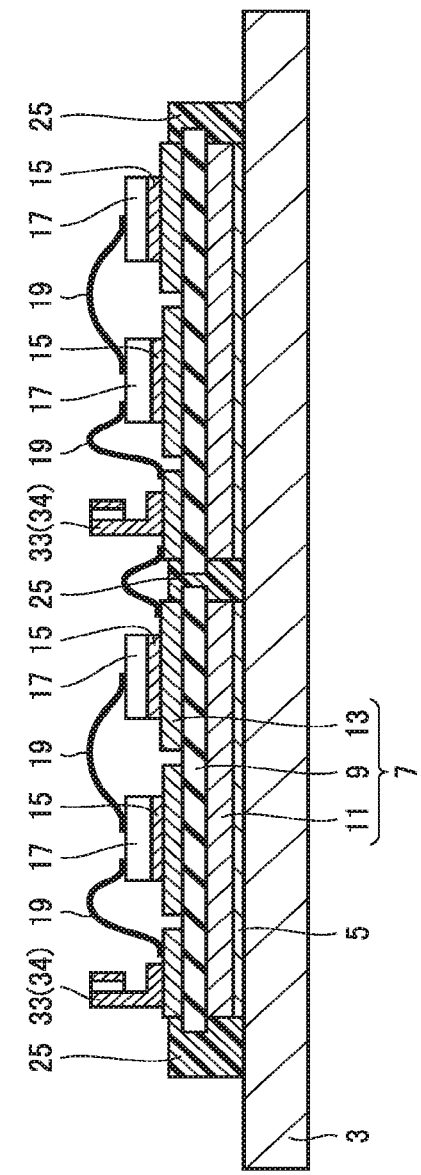
FIG. 6 is a cross-sectional view showing a step performed after the step shown in FIG. 5 in the first embodiment.

Then, as shown in FIG. 5, connected body 33 is joined to an appropriate position in metal plate 13, for example, by ultrasonic waves or thermocompression bonding. Furthermore, in the case where foreign substances such as dispersed metal powder exist when connected body 33 is joined, these foreign substances are removed by blowing air, for example. Then, as shown in FIG. 6, highly-insulating voltage-resisting resin material 25 is applied so as to cover the creepage of insulating substrate 7 and the surface of base plate 3 from the end surface of metal plate 13 to base plate 3. Since main terminal 31 has not yet been connected to connected body 33 at this time, highly-insulating voltage-resisting resin material 25 can be reliably applied to an appropriate portion without being interfered by main terminal 31.

Figure 7:
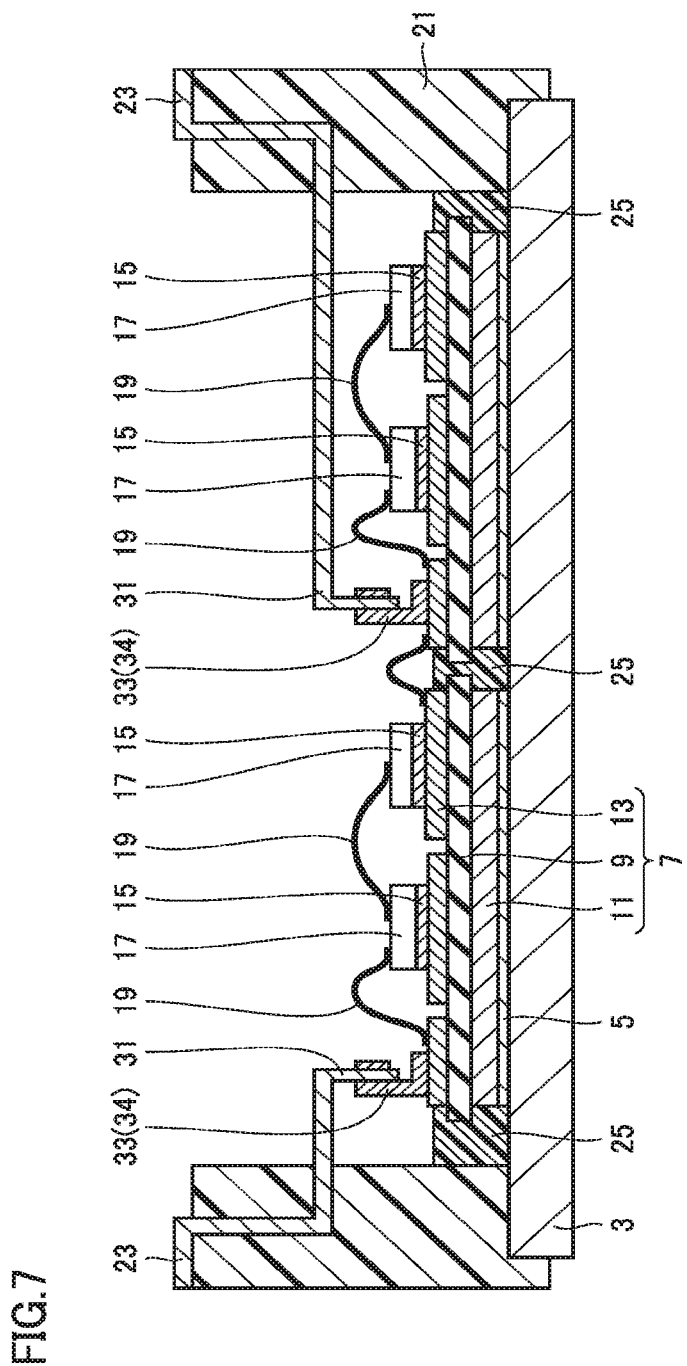
FIG. 7 is a cross-sectional view showing a step performed after the step shown in FIG. 6 in the first embodiment.
Figure 8:
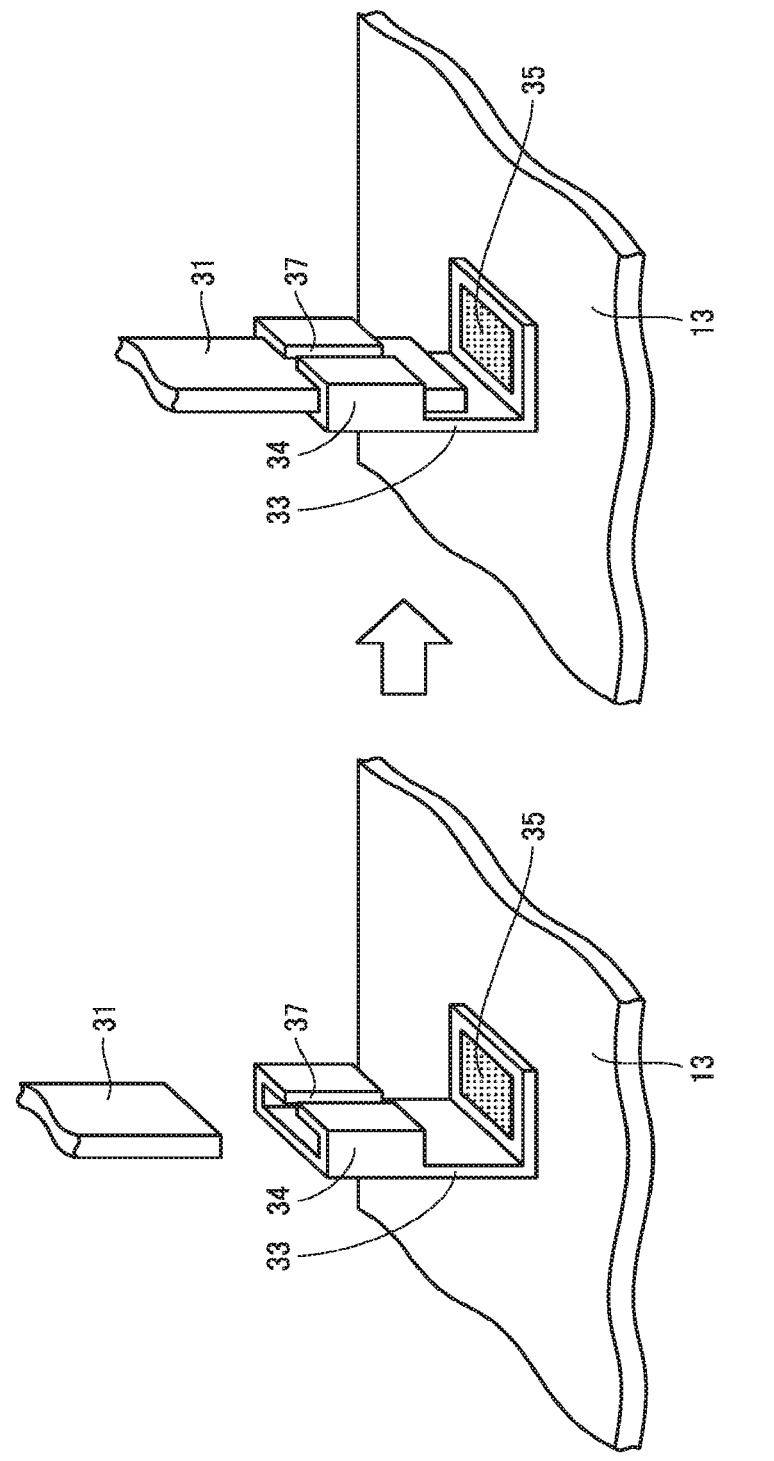
FIG. 8 is an enlarged partial perspective view showing the manner in which the main terminal is connected to the connected body in the step shown in FIG. 7 in the first embodiment.

Then, as shown in FIG. 7, case 21 having main terminal 31 (external terminal 23) insert-molded therein is mounted on base plate 3, for example, with an adhesive (not shown). At this time, as shown in FIG. 8, main terminal 31 is inserted into receiving section 34 of connected body 33 so as to be received in receiving section 34.

Figure 9:
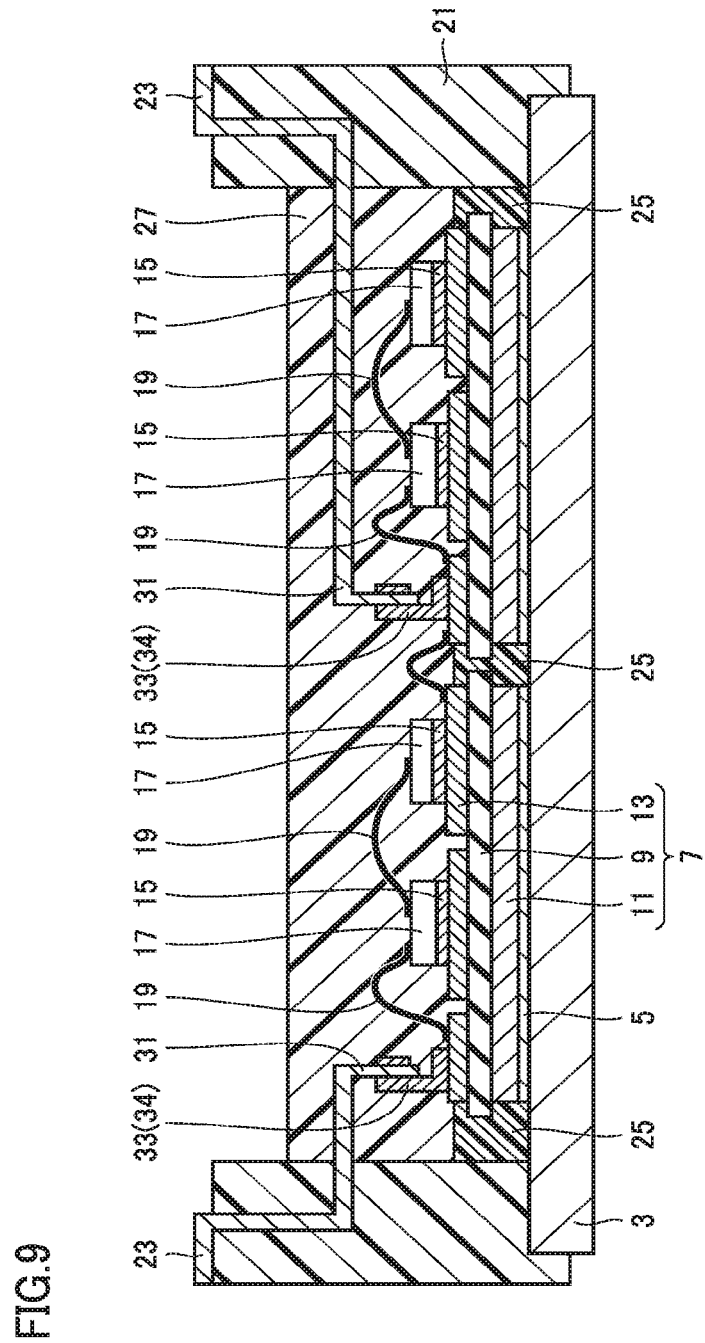
FIG. 9 is a cross-sectional view showing a step performed after the step shown in FIG. 7 in the first embodiment.
Figure 10:
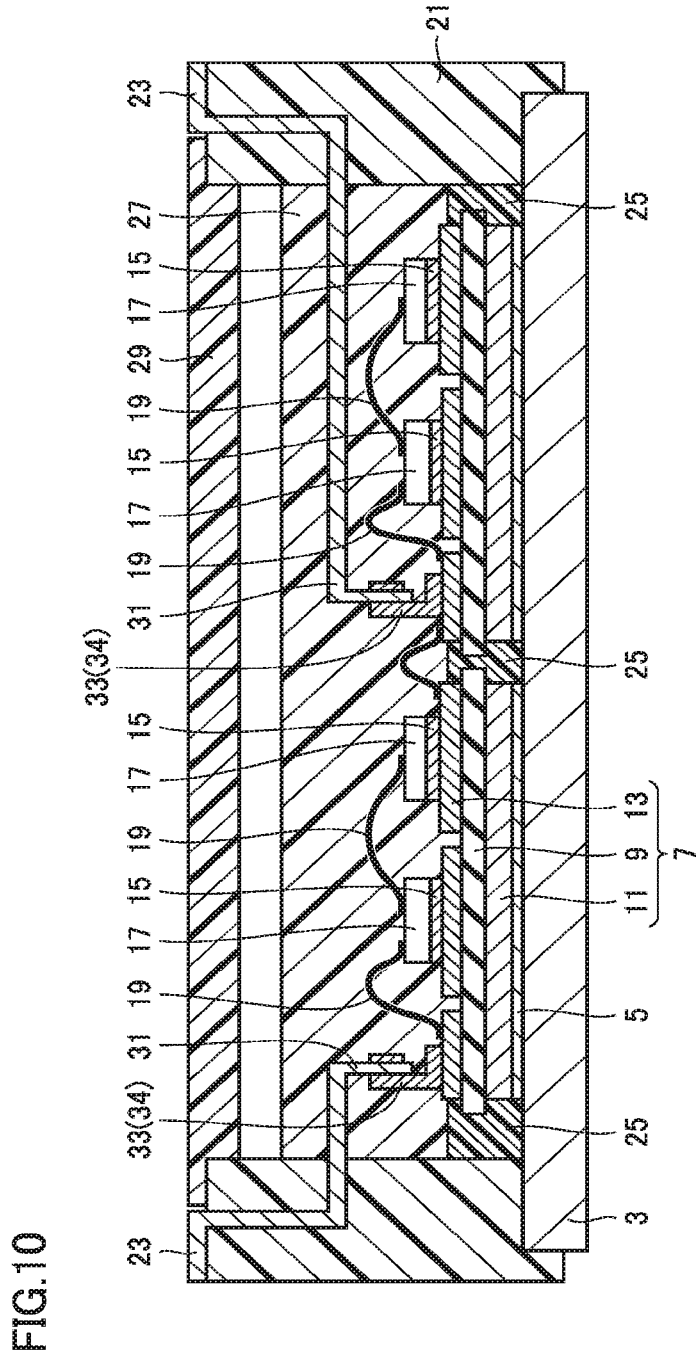
FIG. 10 is a cross-sectional view showing a step performed after the step shown in FIG. 9 in the first embodiment.

Then, as shown in FIG. 9, sealing resin 27 is introduced into case 21 so as to seal power semiconductor element 17, bonding wire 19, main terminal 31, and the like. Then, as shown in FIG. 10, cover 29 is attached to case 21 by bonding or the like, thereby completing a semiconductor power module. In the semiconductor power module as described above, the insulation performance can be improved. This will be described as compared with a semiconductor power module according to a comparative example.

Figure 11:
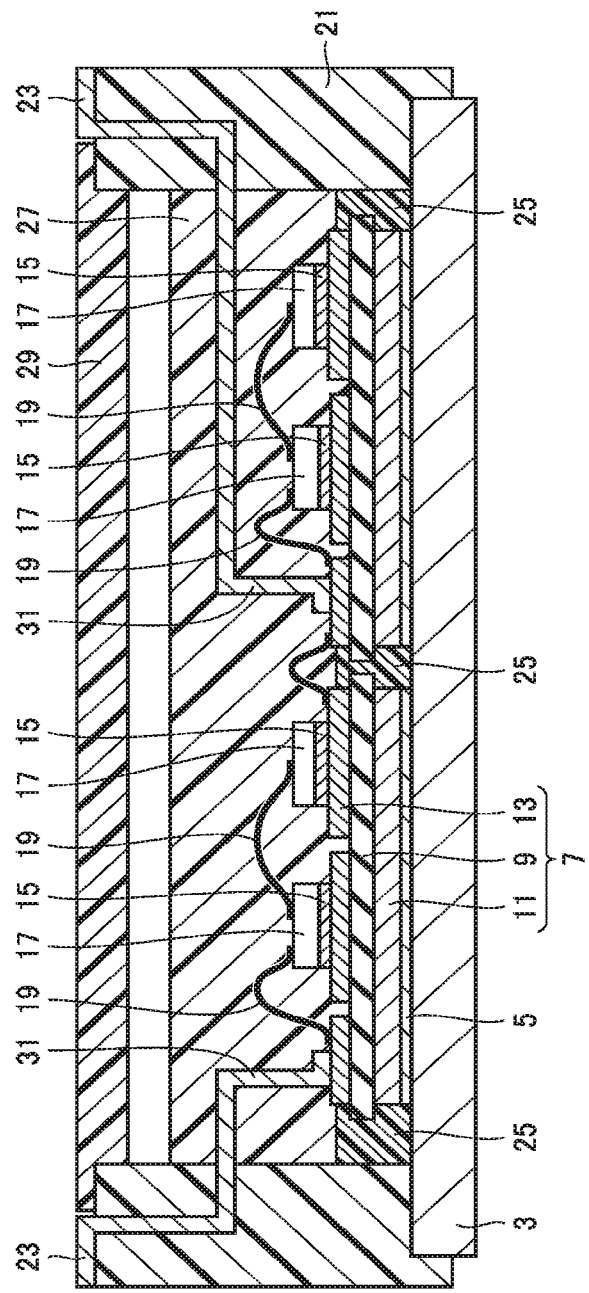
FIG. 11 is a cross-sectional view of a semiconductor power module according to a comparative example.

As shown in FIG. 11, in the semiconductor power module according to the comparative example, main terminal 31 is directly joined to metal plate 13. Since the configuration other than the above is the same as that of semiconductor power module 1 shown in FIG. 2, the same components are designated by the same reference characters, and description thereof will not be repeated unless otherwise required.

Figure 12:
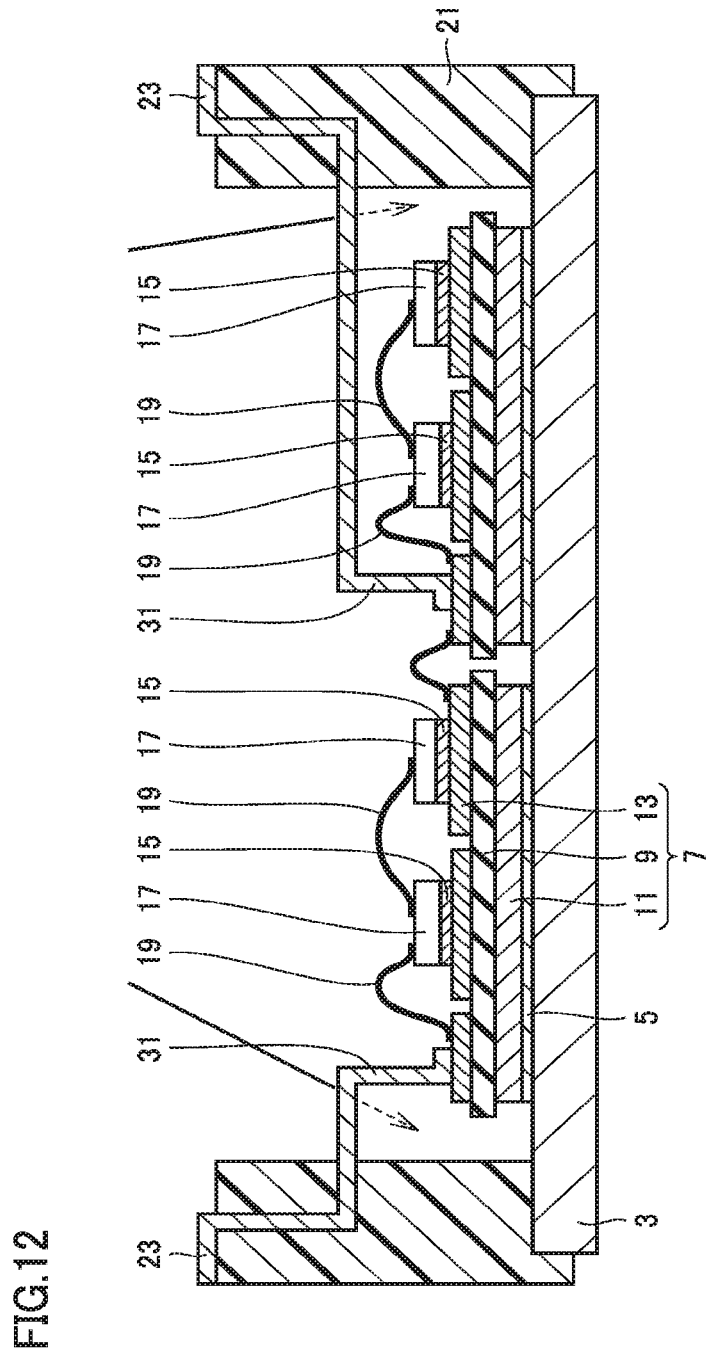
FIG. 12 is a cross-sectional view for illustrating a problem of the semiconductor power module according to the comparative example.

In the semiconductor power module according to the comparative example, highly-insulating voltage-resisting resin material 25 is applied after main terminal 31 is joined to metal plate 13 of insulating substrate 7. In this case, as shown in FIG. 12, there are many extraction paths in metal plate 13 of insulating substrate 7 that extend from a joining portion having main terminal 31 joined thereto to external terminal 23. Thus, in a complicated semiconductor power module, main terminal 31 may prevent stable application of highly-insulating voltage-resisting resin material 25, as indicated by an arrow (including a dotted line portion).

Thus, a portion onto which highly-insulating voltage-resisting resin material 25 is not applied may exist inside the semiconductor power module. Furthermore, inclusion of air bubbles (not shown) may occur in highly-insulating voltage-resisting resin material 25 that has been applied, which may result in an insulation failure.

In order to solve the above-described problem, it is conceivable to apply highly-insulating voltage-resisting resin material 25, and thereafter, join main terminal 31 to metal plate 13 of insulating substrate 7. In this case, since main terminal 31 is not joined to metal plate 13, highly-insulating voltage-resisting resin material 25 can be reliably applied.

Figure 13:
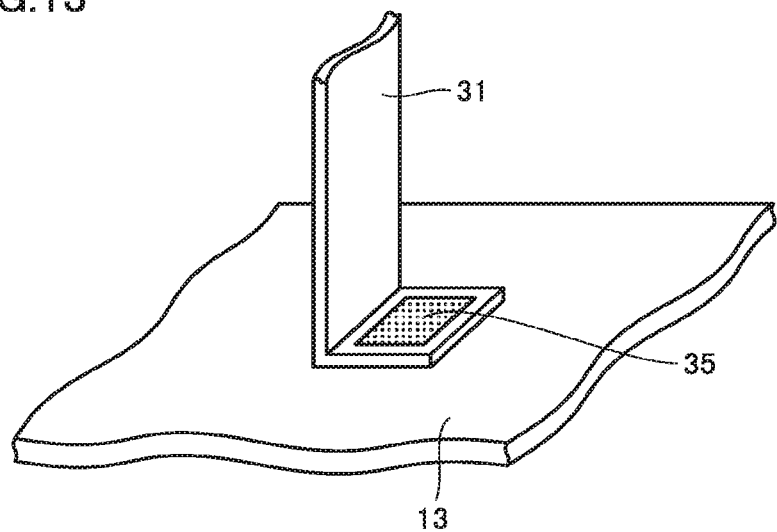
FIG. 13 is an enlarged partial perspective view for illustrating the problem of the semiconductor power module according to the comparative example.
Figure 14:
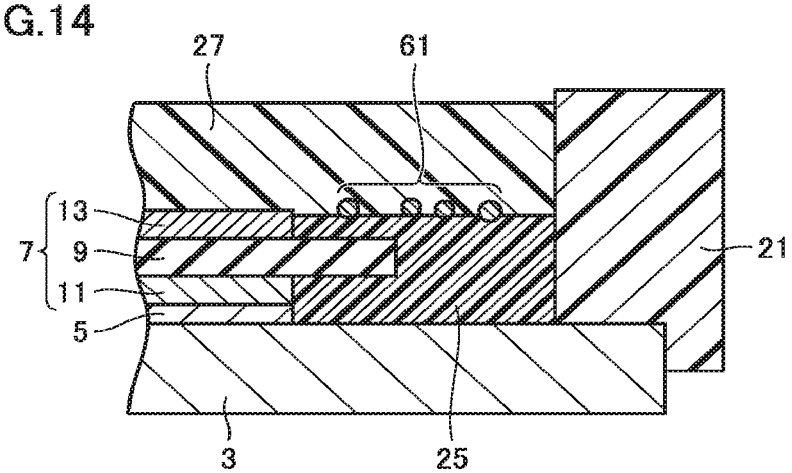
FIG. 14 is an enlarged partial cross-sectional view for illustrating the problem of the semiconductor power module according to the comparative example.

However, as shown in FIG. 13, metal powder 61 (see FIG. 14) is produced when main terminal 31 is joined to metal plate 13 by metal-joining. As shown in FIG. 14, produced metal powder 61 may adhere to highly-insulating voltage-resisting resin material 25. Since highly-insulating voltage-resisting resin material 25 has adhesiveness, metal powder 61 adhering to highly-insulating voltage-resisting resin material 25 cannot be readily removed. Thus, metal powder 61 may cause an insulation failure.

Accordingly, the steps of assembling a semiconductor power module needs to be performed in the following order. Specifically, main terminal 31 is joined to metal plate 13, and thereafter, highly-insulating voltage-resisting resin material 25 is applied. In this case, the size of main terminal 31, handling of main terminal 31 or the like needs to be simplified as much as possible in order to readily apply highly-insulating voltage-resisting resin material 25. Consequently, the flexibility of the wiring design is to be limited.

As compared with the comparative example, in semiconductor power module 1 according to the first embodiment, main terminal 31 is electrically connected to metal plate 13 with connected body 33 interposed therebetween. After connected body 33 is joined to metal plate 13, main terminal 31 is received in receiving section 34 of connected body 33. Thus, after connected body 33 is joined to metal plate 13 and before main terminal 31 is received in receiving section 34, highly-insulating voltage-resisting resin material 25 is applied, thereby allowing reliable application of highly-insulating voltage-resisting resin material 25 without being interfered by main terminal 31.

Furthermore, even if metal powder is produced when connected body 33 is joined to metal plate 13, such metal powder can be removed before application of highly-insulating voltage-resisting resin material 25. Furthermore, even if inclusion of air bubbles occurs in sealing resin 27, these air bubbles can be readily released through slit portion 37 provided in receiving section 34, so that remaining of air bubbles in sealing resin 27 can be suppressed (see FIG. 15).

Thereby, highly-insulating voltage-resisting resin material 25 can be reliably applied so as to cover the creepage of insulating substrate 7 and the surface of base plate 3 from the end surface of metal plate 13 to base plate 3. Furthermore, sealing resin 27 can be applied without adhesion of metal powder and without remaining of air bubbles in sealing resin 27. As a result, the insulation performance of semiconductor power module 1 can be reliably improved.

Figure 15:
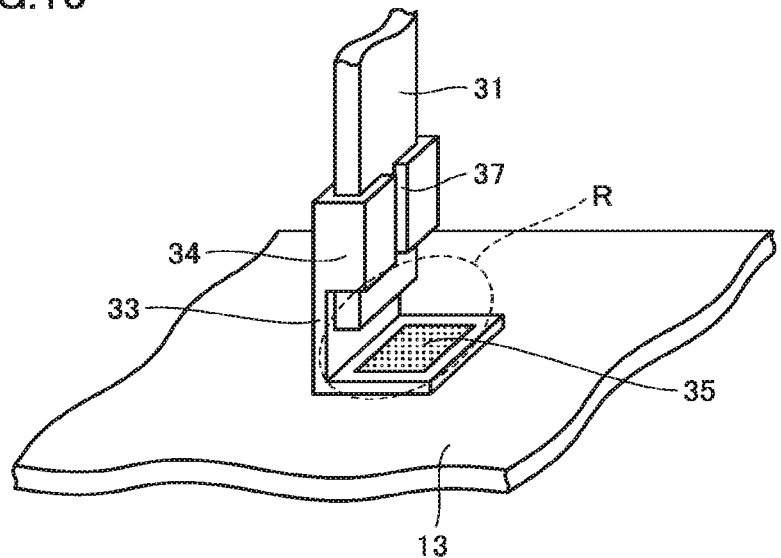
FIG. 15 is the first enlarged partial perspective view for illustrating an effect of the semiconductor power module in the first embodiment.
Figure 16:
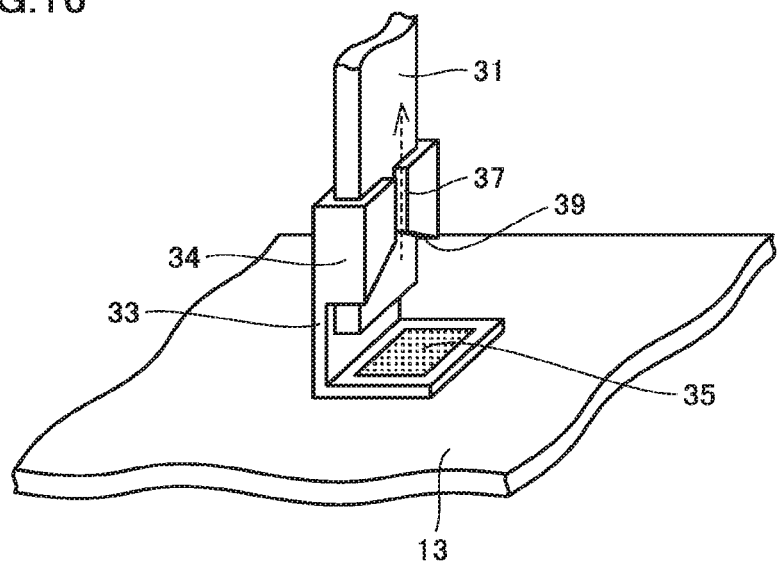
FIG. 16 is the second enlarged partial perspective view for illustrating the effect of the semiconductor power module in the first embodiment.

In particular, when sealing resin 27 is applied, air bubbles tend to remain in a region R between a portion of metal-to-metal joining portion 35 in connected body 33 and a portion of main terminal 31 and receiving section 34 as shown in FIG. 15. In order to efficiently release these air bubbles through slit portion 37, it is preferable that slit portion 37 is provided with a tapered portion 39 as the second tapered portion, as shown in FIG. 16. As a slit space in slit portion 37, tapered portion 39 includes a slit space having a distance between one inclined portion and the other inclined portion so as to gradually narrow from the lower end side of receiving section 34 toward the upper end side of receiving section 34. Thereby, the air bubbles that tend to remain in region R can be collected and reliably released upward.

Furthermore, after application of highly-insulating voltage-resisting resin material 25, main terminal 31 is inserted into connected body 33. This eliminates the need to simplify the size of main terminal 31, handling of main terminal 31 or the like, so that the flexibility of the wiring design can be enhanced.

Figure 17:
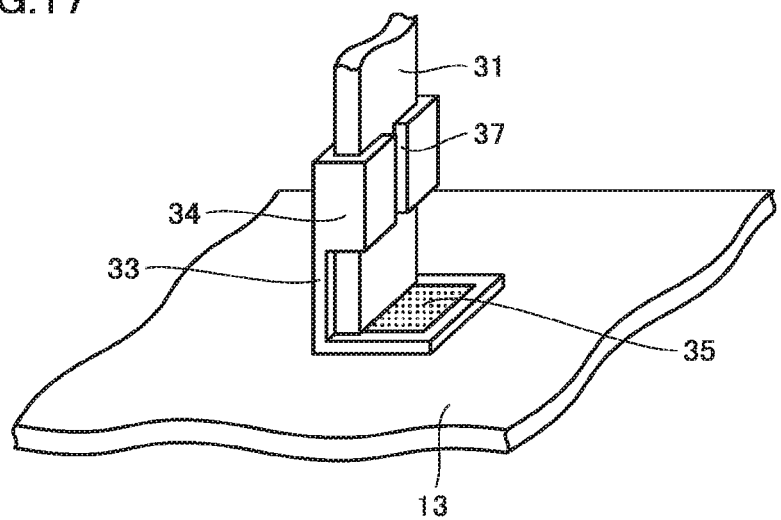
FIG. 17 is an enlarged partial perspective view showing a modification of the semiconductor power module in the first embodiment.

The above semiconductor power module has been described by way of example with regard to the case where there is a distance between a portion of metal-to-metal joining portion 35 in connected body 33 and an end portion of main terminal 31 as shown in FIG. 3. However, as shown in FIG. 17, main terminal 31 may be connected such that the end portion of main terminal 31 comes into contact with the portion of metal-to-metal joining portion 35 in connected body 33. Furthermore, main terminal 31 itself is made of metal bent with prescribed strength. Thus, even when there is a distance between the portion of metal-to-metal joining portion 35 in connected body 33 and the end portion of main terminal 31, main terminal 31 can be aligned in the height direction without any problem.

Second Embodiment

Figure 18:
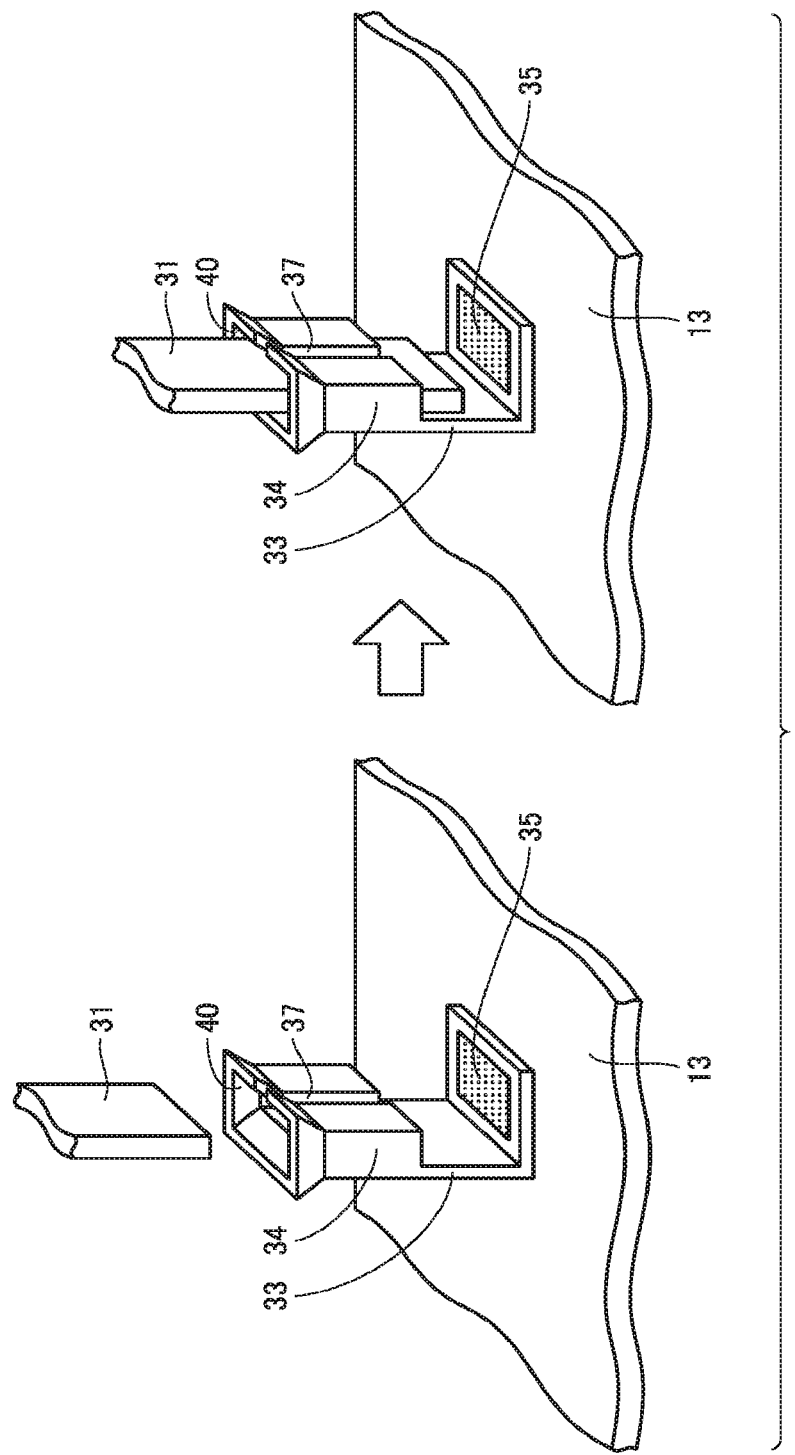
FIG. 18 is an enlarged partial perspective view showing the manner of connection between a main terminal and a connected body in a semiconductor power module according to the second embodiment of the present invention.

A semiconductor power module according to the second embodiment will be hereinafter described. As shown in FIG. 18, connected body 33 in semiconductor power module 1 is provided with a tapered portion 40 as the first tapered portion on the upper end side of receiving section 34. Tapered portion 40 is formed to expand outward (upward). Since the configuration other than the above is the same as that of semiconductor power module 1 shown in FIGS. 1 and 2, the same components are designated by the same reference characters, and description thereof will not be repeated unless otherwise required.

In addition to the effects having been described with regard to semiconductor power module 1 according to the first embodiment, semiconductor power module 1 as described above achieves the following effect. Specifically, in the above-described semiconductor power module 1, tapered portion 40 that expands upward is provided on the upper end side of receiving section 34 in connected body 33.

Thus, even if main terminal 31 is slightly misaligned with respect to receiving section 34 when main terminal 31 is received in receiving section 34 during assembly of semiconductor power module 1, main terminal 31 is reliably guided by tapered portion 40 to receiving section 34 so as to allow main terminal 31 to be reliably received in receiving section 34.

Third Embodiment

The first and second embodiments have been described by way of example with regard to the semiconductor power module having a connected body provided with a receiving section. In the following, a semiconductor power module having a main terminal provided with a receiving section will be described.

Figure 19:
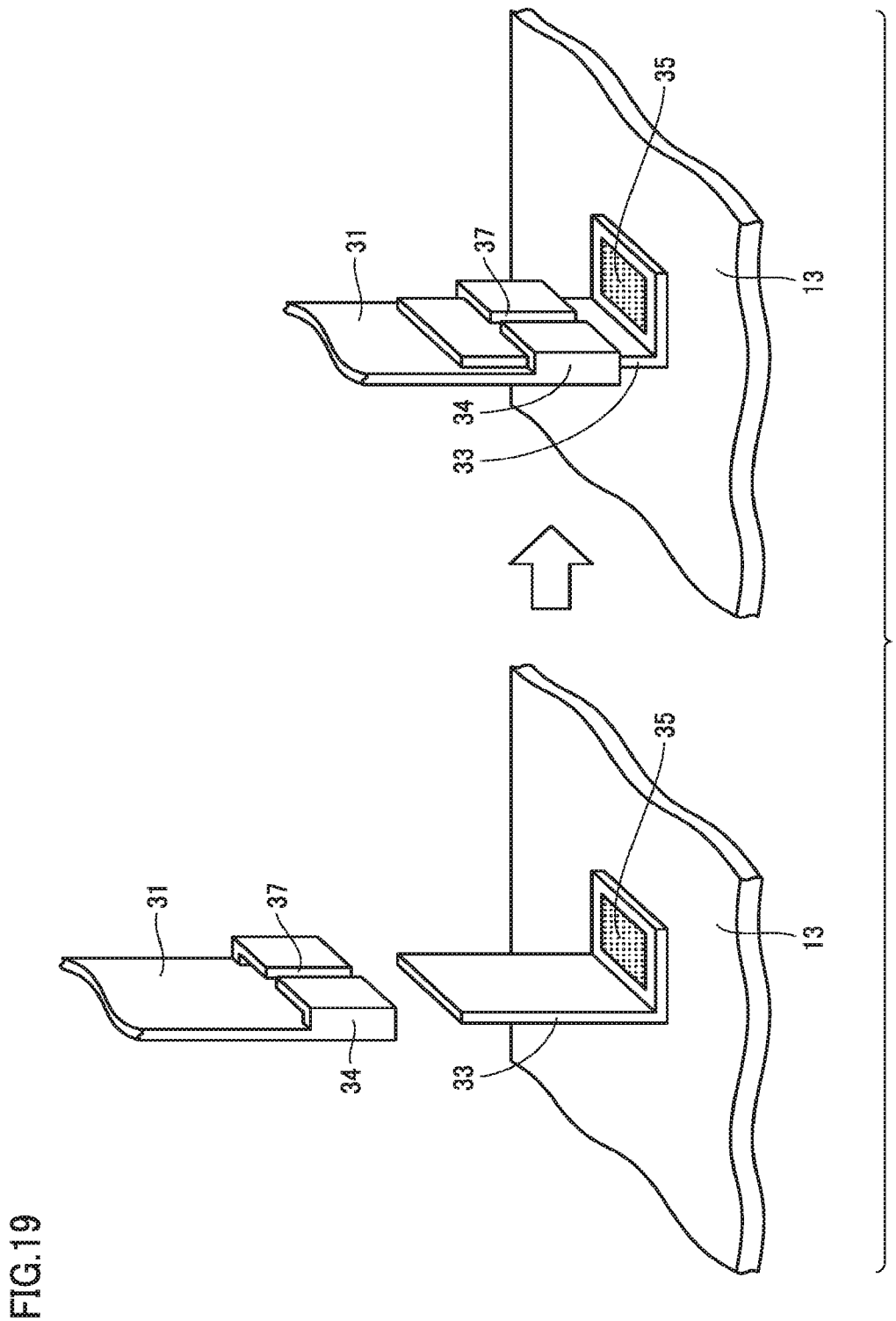
FIG. 19 is an enlarged partial perspective view showing the manner of connection between a main terminal and a connected body in a semiconductor power module according to the third embodiment of the present invention.

As shown in FIG. 19, main terminal 31 in semiconductor power module 1 is provided with receiving section 34 in which connected body 33 is received. Connected body 33 is inserted from the lower end side of receiving section 34 and received in receiving section 34. Receiving section 34 is provided with a slit portion 37. Since the configuration other than the above is the same as that of semiconductor power module 1 shown in FIGS. 1 and 2, the same components are designated by the same reference characters, and description thereof will not be repeated unless otherwise required.

In addition to the effects having been described with regard to semiconductor power module 1 according to the first embodiment, semiconductor power module 1 as described above achieves the following effects. Specifically, in the above-mentioned semiconductor power module 1, main terminal 31 is provided with receiving section 34 in which connected body 33 is received, but connected body 33 is not provided with a receiving section.

An area of the portion at which connected body 33 and metal plate 13 (insulating substrate 7) come into contact with each other is approximately the same between the case of the above-mentioned semiconductor power module 1 and the case of semiconductor power module 1 according to each of the first and second embodiments.

In semiconductor power module 1 according to each of the first and second embodiments, when connected body 33 having receiving section 34 is joined to metal plate 13, the displacing amount of a metal-to-metal joint tool (jig) needs to be taken into consideration so as to ensure a region of the portion where connected body 33 is brought into contact with metal plate 13 (insulating substrate 7). This is however not required in the above-mentioned semiconductor power module since connected body 33 is not provided with a receiving section.

Also, in the similar manner as having been described in the third embodiment (see FIG. 18), a tapered portion (not shown) expanding downward may be provided as the third tapered portion on the lower end side of receiving section 34 (shown in FIG. 19) on which metal plate 13 is located. In other words, tapered portion 40 shown in FIG. 18 may be provided so as to expand downward on the lower end side of receiving section 34 shown in FIG. 19.

In this case, even if receiving section 34 of main terminal 31 is slightly misaligned with respect to connected body 33 when connected body 33 is received in receiving section 34, main terminal 31 (receiving section 34) is reliably guided by the tapered portion to connected body 33 so as to allow connected body 33 to be received in receiving section 34. Furthermore, receiving section 34 shown in FIG. 19 is provided with a tapered portion, as the fourth tapered portion, similar to tapered portion 39 shown in FIG. 16, so that air bubbles can be reliably released.

Fourth Embodiment

The following is an explanation about an example of a semiconductor power module in which a main terminal and a connected body are electrically connected by metal-to-metal joining.

Figure 20:
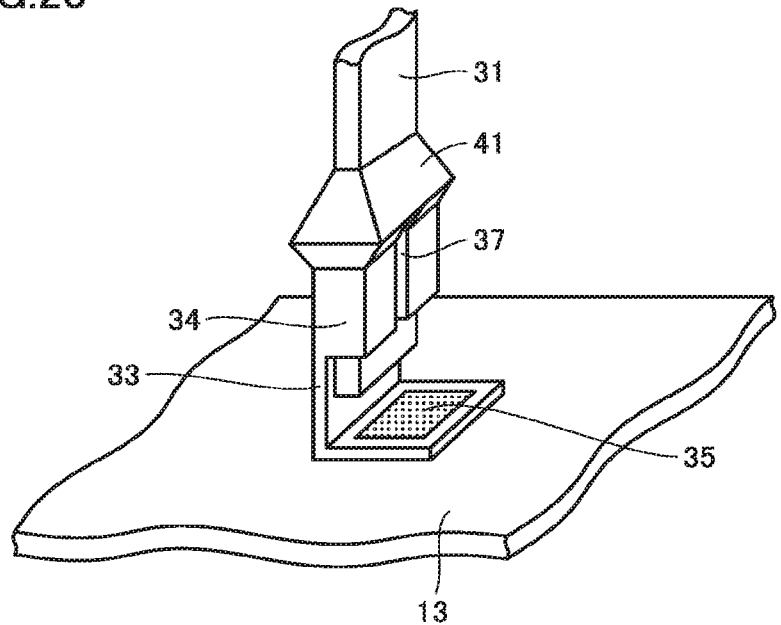
FIG. 20 is an enlarged partial perspective view showing a connection portion between a main terminal and a connected body in a semiconductor power module according to the fourth embodiment of the present invention.

As shown in FIG. 20, in semiconductor power module 1, in the state where main terminal 31 is received in receiving section 34 of connected body 33, main terminal 31 and connected body 33 are joined by metal-to-metal joining, for example, by solder 41. As main terminal 31 and connected body 33 in this case, main terminal 31 and connected body 33 as having been described in the first to third embodiments are applied. Since the configuration other than the above is the same as that of semiconductor power module 1 shown in FIGS. 1 and 2, the same components are designated by the same reference characters, and description thereof will not be repeated unless otherwise required.

In addition to the effects having been described with regard to semiconductor power module 1 according to the first embodiment, semiconductor power module 1 as described above achieves the following effects.

In semiconductor power module 1, the insulation performance and the heat resisting performance each are different depending on the product to which semiconductor power module 1 is applied. Thus, the viscosity of the sealing resin to be applied is also different depending on the product to which semiconductor power module 1 is applied. It is assumed herein that a sealing resin having relatively low viscosity is used as sealing resin 27. In this case, it is conceivable that, in the state where main terminal 31 is simply received in receiving section 34 of connected body 33, sealing resin 27 with low viscosity permeates by capillarity through the gap between main terminal 31 and receiving section 34. In such a case, it is considered that an electrical connection between main terminal 31 and receiving section 34 may be interfered.

In the above-mentioned semiconductor power module 1, main terminal 31 and connected body 33 are joined to each other by metal-to-metal joining by solder 41, thereby eliminating the gap through which sealing resin 27 permeates. As a result, an intended electrical connection is not interfered. Furthermore, by metal-to-metal joining of main terminal 31 and connected body 33 by solder 41, the connection strength against the stress at a high temperature can be improved, so that the electrical connection reliability can also be improved.

Fifth Embodiment

The following is an explanation about another example of the semiconductor power module in which a main terminal and a connected body are electrically connected by metal-to-metal joining.

Figure 21:
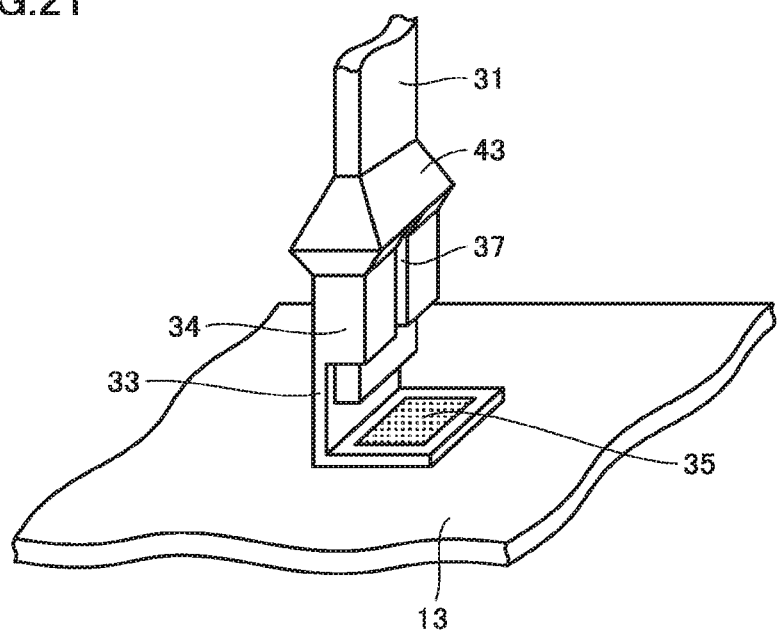
FIG. 21 is an enlarged partial perspective view showing a connection portion between a main terminal and a connected body in a semiconductor power module according to the fifth embodiment of the present invention.

As shown in FIG. 21, in semiconductor power module 1, main terminal 31 and connected body 33 are joined to each other by metal-to-metal joining, for example, by an electrically conductive adhesive 43 such as a silver paste in the state where main terminal 31 is received in receiving section 34 of connected body 33. Main terminal 31 and connected body 33 as described in the first to third embodiments are applied as main terminal 31 and connected body 33. Since the configuration other than the above is the same as that of semiconductor power module 1 shown in FIGS. 1 and 2, the same components are designated by the same reference characters, and description thereof will not be repeated unless otherwise required.

In the above-mentioned semiconductor power module 1, main terminal 31 and connected body 33 are joined to each other by metal-to-metal joining by electrically conductive adhesive 43, thereby eliminating the gap through which sealing resin 27 permeates, similarly to the case of solder 41. As a result, an intended electrical connection is not interfered. Furthermore, by metal-to-metal joining of main terminal 31 and connected body 33 by electrically conductive adhesive 43, the connection strength against the stress at a high temperature can be improved, so that the electrical connection reliability can also be improved. As electrically conductive adhesive 43, for example, a paste containing metal such as a copper paste is applicable in addition to a silver paste.

Sixth Embodiment

The following is an explanation about a power conversion device to which the power module according to the above-mentioned first to fifth embodiments is applied. Although the present invention is not limited to a specific power conversion device, the following is an explanation about the sixth embodiment in which the present invention is applied to a three-phase inverter.

Figure 22:
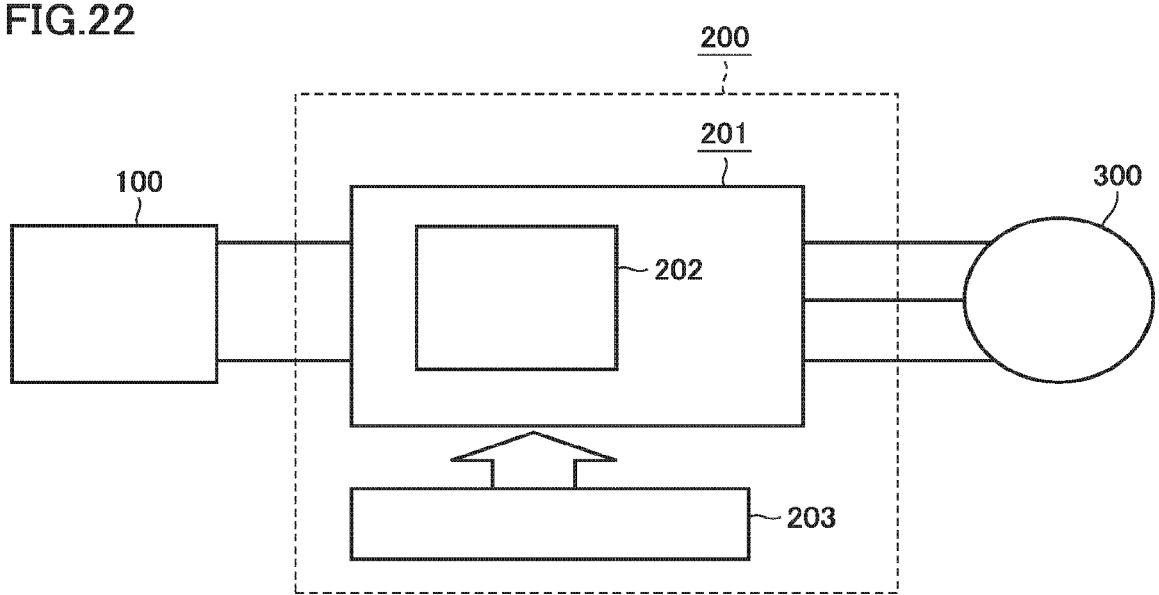
FIG. 22 is a block diagram of a power conversion device to which a semiconductor power module is applied, according to the sixth embodiment of the present invention.

FIG. 22 is a block diagram showing the configuration of a power conversion system to which a power conversion device according to the present embodiment is applied. The power conversion system shown in FIG. 22 is formed of a power supply 100, a power conversion device 200, and a load 300. Power supply 100 is a direct-current (DC) power supply and supplies DC power to power conversion device 200. Power supply 100 may be of various types of products and can be formed of a DC system, a solar cell, and a storage battery, for example. Power supply 100 may also be formed of a rectifier circuit connected to an alternating-current (AC) system or formed of an AC/DC converter. Furthermore, power supply 100 may be formed of a DC/DC converter that converts DC power output from the DC system into prescribed electric power.

Power conversion device 200 is a three-phase inverter connected between power supply 100 and load 300, and serves to convert the DC power supplied from power supply 100 into AC power, and then supplies AC power to load 300. As shown in FIG. 22, power conversion device 200 includes: a main conversion circuit 201 that converts DC power into AC power and outputs the converted AC power; and a control circuit 203 that outputs a control signal for controlling main conversion circuit 201 to main conversion circuit 201.

Load 300 is a three-phase electric motor that is driven by AC power supplied from power conversion device 200. Load 300 is not limited to a specific application, but is an electric motor mounted in each of various electric devices, and used as an electric motor, for example, for a hybrid vehicle, an electric vehicle, a railroad vehicle, an elevator, or an air conditioner.

The following is an explanation about the details of power conversion device 200. Main conversion circuit 201 includes a switching element and a freewheeling diode (each of which is not shown). The switching element performs a switching operation to thereby convert the DC power supplied from power supply 100 into AC power, which is then supplied to load 300. While the specific circuit configuration of main conversion circuit 201 may be of various types of configuration, main conversion circuit 201 according to the present embodiment is a three-phase full bridge circuit configured in two levels, and can be formed of six switching elements and six freewheeling diodes that are connected in antiparallel to the respective six switching elements.

In at least any one of the switching elements and the freewheeling diodes in main conversion circuit 201, semiconductor power module 1 according to any one of the above-mentioned first to fifth embodiments is formed as a semiconductor module 202. Six switching elements are configured such that each two switching elements are connected in series to form an upper arm and a lower arm. Each of the pairs of upper and lower arms forms a corresponding phase (a U-phase, a V-phase, and a W-phase) of a full bridge circuit. The output terminals of the upper and lower arms, that is, three output terminals of main conversion circuit 201, are connected to load 300.

Furthermore, main conversion circuit 201 includes a drive circuit (not shown) that drives each switching element. In main conversion circuit 201, the drive circuit may be incorporated in semiconductor module 202 or may be provided separately from semiconductor module 202. The drive circuit generates a drive signal for driving each switching element in main conversion circuit 201, and supplies the generated drive signal to the control electrode of each switching element in main conversion circuit 201. Specifically, according to the control signal from control circuit 203 (described later), the drive signal for bringing each switching element into an ON state and the drive signal for bringing each switching element into an OFF state are output to the control electrode of each switching element. When the switching element is maintained in an ON state, the drive signal is a voltage signal (an ON signal) equal to or greater than a threshold voltage of the switching element. When the switching element is maintained in an OFF state, the drive signal is a voltage signal (an OFF signal) equal to or less than the threshold voltage of the switching element.

Control circuit 203 controls each switching element in main conversion circuit 201 so as to supply desired electric power to load 300. Specifically, the time (ON time) at which each switching element in main conversion circuit 201 is to be brought into an ON state is calculated based on the electric power to be supplied to load 300. For example, main conversion circuit 201 can be controlled by PWM control for modulating the ON time of each switching element according to the voltage to be output. Then, a control command (control signal) is output to the drive circuit included in main conversion circuit 201 such that an ON signal is output to the switching element that should be brought into an ON state at each time and an OFF signal is output to the switching element that should be brought into an OFF state at each time. According to this control signal, the drive circuit outputs an ON signal or an OFF signal as a drive signal to the control electrode of each switching element.

In the power conversion device according to the present embodiment, semiconductor power module 1 according to any one of the first to fifth embodiments is applied as semiconductor module 202 to at least any one of the switching elements and the freewheeling diodes in main conversion circuit 201. Thus, the reliability of the power conversion device can be improved.

The present embodiment has been described with regard to the example in which the present invention is applied to a three-phase inverter configured in two levels, but the present invention is not limited thereto and can be applied to various types of power conversion devices. In the present embodiment, the power conversion device is configured in two levels, but the power conversion device may be configured in three levels or in a multilevel. Also, in the case where electric power is supplied to a single-phase load, the present invention may be applied to a single-phase inverter. Furthermore, in the case where electric power is supplied to a DC load or the like, the present invention may also be applicable to a DC/DC converter or an AC/DC converter.

Furthermore, the power conversion device to which the present invention is applied is not limited to the above-mentioned case where the load is an electric motor, but can also be used as a power supply device for an electrical discharge machine, a laser beam machine, an induction heating cooking machine, or a contactless power feeding system, for example. Furthermore, the power conversion device to which the present invention is applied can also be used as a power conditioner for a solar power generation system, a power storage system or the like.

In each of the embodiments, receiving section 34 is described as having a rectangular box-shaped tube by way of example, but the shape of receiving section 34 is not limited thereto as long as receiving section 34 can receive main terminal 31 or connected body 33 and establish an electrical connection therebetween. Furthermore, the semiconductor power modules described in the above embodiments can be variously combined as required. Also, the dependency of the claims is intended to be set according to the combination.

The embodiments disclosed herein are merely by way of example and not limited thereto. The scope of the present invention is defined by the terms of the claims, rather than the description above, and is intended to include any modifications within the meaning and scope equivalent to the terms of the claims.

INDUSTRIAL APPLICABILITY

The present invention is effectively utilized for a semiconductor power module in which a power semiconductor element and the like are sealed by a sealing material.

REFERENCE SIGNS LIST 1 power module semiconductor device, 3 base plate, 5 solder, 7 insulating substrate, 9 insulating layer, 11 metal plate, 13 metal plate, 15 solder, 17 power semiconductor element, 19 bonding wire, 21 case, 23 external terminal, 25 highly-insulating voltage-resisting resin material, 27 sealing resin, 29 cover, 31 main terminal, 33 connected body, 34 receiving section, 35 metal-to-metal joining portion, 37 slit portion, 39, 40 tapered portion, 41 solder, 43 silver paste, R region, 61 metal powder, 100 power supply, 200 power conversion device, 201 main conversion circuit, 202 semiconductor module, 203 control circuit, 300 load.

The invention claimed is:

1. A semiconductor power module comprising:
a base plate;
an insulating substrate mounted on the base plate and including a conductive pattern;
a power semiconductor element mounted on the conductive pattern;
a case member mounted on the base plate so as to surround the insulating substrate;
a main terminal attached to the case member and electrically connecting to an outside;
a connected body to which the main terminal is connected, the connected body being connected to the conductive pattern; and
a sealing material introduced into the case member to seal the insulating substrate, the main terminal and the connected body, wherein
the main terminal and the connected body include
a receiving section provided in one of the main terminal and the connected body and receiving the other of the main terminal and the connected body, and
a slit portion formed in the receiving section so as to extend from a first end portion of the receiving section toward a second end portion of the receiving section, wherein the first end portion is located on a side close to the insulating substrate, and the second end portion is located opposite to the side close to the insulating substrate.

2. The semiconductor power module according to claim 1, wherein
the receiving section is provided in the connected body, and
the main terminal is received in the receiving section from the second end portion in the receiving section.

3. The semiconductor power module according to claim 2, wherein
the second end portion in the receiving section is provided with a first tapered portion that expands outward.

4. The semiconductor power module according to claim 3, wherein
the slit portion includes a second tapered portion having a slit space that gradually narrows from the first end portion toward the second end portion.

5. The semiconductor power module according to claim 2, wherein
the slit portion includes a second tapered portion having a slit space that gradually narrows from the first end portion toward the second end portion.

6. The semiconductor power module according to claim 1, wherein
the receiving section is provided in the main terminal, and
the connected body is received in the receiving section from the first end portion in the receiving section.

7. The semiconductor power module according to claim 6, wherein
the first end portion in the receiving section is provided with a third tapered portion that expands outward.

8. The semiconductor power module according to claim 7, wherein
the slit portion includes a fourth tapered portion having a slit space that gradually narrows from the first end portion toward the second end portion.

9. The semiconductor power module according to claim 6, wherein
the slit portion includes a fourth tapered portion having a slit space that gradually narrows from the first end portion toward the second end portion.

10. The semiconductor power module according to claim 1, wherein
the main terminal and the connected body are connected by metal-to-metal joining.

11. The semiconductor power module according to claim 10, wherein
the metal-to-metal joining includes joining by solder.

12. The semiconductor power module according to claim 10, wherein
the metal-to-metal joining includes joining by an electrically conductive adhesive.

13. The semiconductor power module according to claim 1, wherein
the sealing material includes a first sealing material that seals the insulating substrate, and
a second sealing material that is introduced to cover the first sealing material.

14. The semiconductor power module according to claim 1, wherein
the receiving section has a shape including a shape of a rectangular box-shaped tube.

15. A power conversion device comprising:
a main conversion circuit to convert received electric power and output converted electric power, wherein the main conversion circuit includes the semiconductor power module according to claim 1; and
a control circuit to output a control signal for controlling the main conversion circuit to the main conversion circuit.

* * * * *